United States Patent [19]

Pena-Finol et al.

[11] Patent Number: 5,381,114

[45] Date of Patent: Jan. 10, 1995

[54] CONTINUOUS TIME COMMON MODE FEEDBACK AMPLIFIER

[75] Inventors: Jesus S. Pena-Finol, Coral Springs; Mark J. Chambers; James B. Phillips, both of Plantation, all of Fla.

[73] Assignee: Motorola, Inc., Schaumburg, Ill.

[21] Appl. No.: 223,416

[22] Filed: Apr. 4, 1994

[51] Int. Cl.6 .............................................. H03F 3/45
[52] U.S. Cl. ................................... 330/258; 330/253; 330/257
[58] Field of Search ....................... 330/253, 257, 258

[56] References Cited

U.S. PATENT DOCUMENTS 4,825,173 4/1989 Cornett .......................... 330/258 X

OTHER PUBLICATIONS

IEEE Journal of Solid-State Circuits, vol. SC-17, No. 6, "A Family of Differential NMOS Analog Circuits for a PCM Codec Filer Chip" pp. 1014–1023, Dec. 1982.
IEEE Journal of Solid-State Circuits, vol. SC-19, No. 6, "A Ratio-Independent Algorithmic Analog-to-Digital Conversion Technique" pp. 828–836, Dec. 1984.
IEEE Journal of Solid-State Circuits, vol. SC-22, No. 6, "A Pipelined 5-Msample/s 9-bit Analog-to-digital converter" pp. 954–960, Dec. 1987.
IEEE Journal of Solid-State Circuits, vol. SC-17, No. 6, "A Pipelined 13-bit, 250-ks/s, 5-v Analog-to-digital Converter" pp. 1316–1323, Dec. 1988.
Gregorian R., and Temes G, Analog Mos integrated Circuit, New York: Wiley-Interscience, 1986, pp. 254–256.

Primary Examiner—James B. Mullins
Attorney, Agent, or Firm—Pedro P. Hernandez

[57] ABSTRACT

A continuous time common mode feedback amplifier CTCMFB (300) is suitable for applications requiring fully differential amplifiers in low voltage supply requirements. Two mirror image, low gain CMOS amplifiers (MP0/MP2 and MP3/MP4) in the CTCMFB (300) define and stabilize the common mode output voltage, Vcm, of the main differential amplifier (102). The transient response of the common mode amplifier (300) can be adjusted independently of the transient response of the main differential amplifier (102), allowing fast transient response to the main differential amplifier.

13 Claims, 3 Drawing Sheets

16
CONTINUOUS TIME COMMON MODE FEEDBACK AMPLIFIER

TECHNICAL FIELD

This invention relates to electronic circuits, and more specifically to differential operational amplifier circuits.

BACKGROUND

In a high speed fully differential switched capacitor filter architecture, a main differential amplifier loop usually includes a high speed common mode loop amplifier within the main differential loop amplifier. A block diagram of a fully differential operational amplifier with common mode feedback is shown in FIG. 1 of the accompanying drawings. The amplifier 100 is comprised of a main differential amplifier 102 and a common mode amplifier 104 supplied by voltage signals Vcc and Vee. The main differential amplifier 102 also includes inputs for receiving an inverting and non-inverting input, differential inputs Vin− and Vin+. Also included in the main differential amplifier 102 are a bias port, ibias, for receiving a bias current, Idm, and an input port, Vcmin, for receiving a common mode control signal, or common mode feedback signal. The output signals of the main differential amplifier 102 are differential outputs Vo+ and Vo−.

The common mode amplifier 104 takes the differential outputs of the main differential amplifier 102, Vo+ and Vo−, and feeds them into input ports Vcmp and Vcmn respectively. The common mode amplifier 104 includes a bias port, icmbias, for receiving a current source Icm, and also has a reference port Vag for receiving a reference input voltage. Also included in the common mode amplifier 104 is a control output port, Vcontrol, coupled to the Vcmin port of the main differential amplifier 102.

The common mode output signal for the operational amplifier 100 is defined by (Vo+ +Vo−)/2. This common mode output signal can be undefined and cause the output of the op amp to drift from a high gain region to a low gain region. To prevent this condition, a form of common mode feedback is used in order to define and stabilize the common mode output signal. Also, it is desirable to have a settling time response in the common mode amplifier 104 that is fast enough to avoid slowing the settling time response of the main differential amplifier 102. The output voltage swing, Vd, of the fully differential op-amp 100 is determined by the differential output voltages, where Vd=Vo+ + −Vo−. The common mode voltage, Vcm, of the differential op-amp 100 is determined by the average of the differential output voltages, where Vcm=(Vo+ +Vo−)/2 with respect to a reference voltage, Vag. If the common mode voltage, Vcm, is continuously compared with a constant reference voltage, such as Vag=analog ground, then the common mode feedback circuit is referred to as a continuous time common mode feedback circuit, CTCMFB.

A typical fully differential CMOS op-amp with CTCMFB is shown in FIG. 2 as fully differential op-amp 200. The fully differential op-amp 200 is comprised of FET transistors and is supplied by supply inputs Vcc and Vee and includes differential inputs Vin+ and Vin−. The main differential amplifier is represented by section 206 shown biased by current source Idm in section 202. The common mode amplifier is comprised of transistors M3, M4, M5, M6, M7 and M10 and overlaps with part of the main differential amplifier 206 which includes M5, M6, M7, M8, M9, and M10. Thus common mode amplifier 204 is a part of the main differential amplifier 206.

The common mode feedback operates by fixing the gate voltage of transistors M5 and M6 to a bias voltage Vb1 and establishing similar currents I+Io/2 through the gates M5 and M6 thus establishing stable source voltages. Once the source voltages for M5 and M6 are stabilized, the drain-to-source voltage for transistors M3 and M4, Vds3 and Vds4, become fixed. The value of Vb1 is chosen such that both transistors M3 and M4 operate in their linear regions. Aspect ratios, channel width vs. channel length, for transistors M3 and M4, (W/L)3=(W/L)4, are selected such that the common mode voltage, Vcm, has a predetermined value, such as ground potential. If the common mode voltage varies, the resistance of transistors M3 and M4 will vary accordingly and force Vcm back to its predetermined value due to the negative feedback nature of the circuit. The output voltage swing of the common mode feedback scheme shown in FIG. 2 is determined by the excess saturation voltage, Vds$_{sat}$, of the output transistors, M 9/M10 and M7/M8 and is very process sensitive. The disadvantages associated with typical common mode feedback schemes include the inability to use them in single low voltage power supply environments without severely limiting the output voltage swing, (Vo+ −Vo−), of the operational amplifier.

In another common mode feedback scheme (not shown), the common mode voltage, Vcm, is periodically refreshed to the common mode reference voltage, Vag, then the common mode feedback circuit is referred to as dynamic common mode feedback, DCMFB. For dual supply systems Vag=ground potential. In single supply low voltage applications, the DCMFB approach is preferred, to increase the output voltage swing and improve time response. However, DCMFB circuits are based on switched capacitor techniques and introduce additional switching noise to the output signal.

Other common mode amplifiers schemes include those designed with resistors. These amplifiers have problems in that resistor tolerances in CMOS are poorly controlled, and the large value resistors typically used in operational amplifier circuits degrade the performance of the amplifier by limiting the output voltage swing, thereby forcing operation at higher supply voltages where the limited voltage swing is not a disadvantage.

Hence, there is a need for a continuous time common mode feedback amplifier circuit suitable for low voltage single supply applications that provides a wide output voltage swing with fast transient response times.

DETAILED DESCRIPTION OF THE PREFERRED EMBODIMENT

Figure 1:
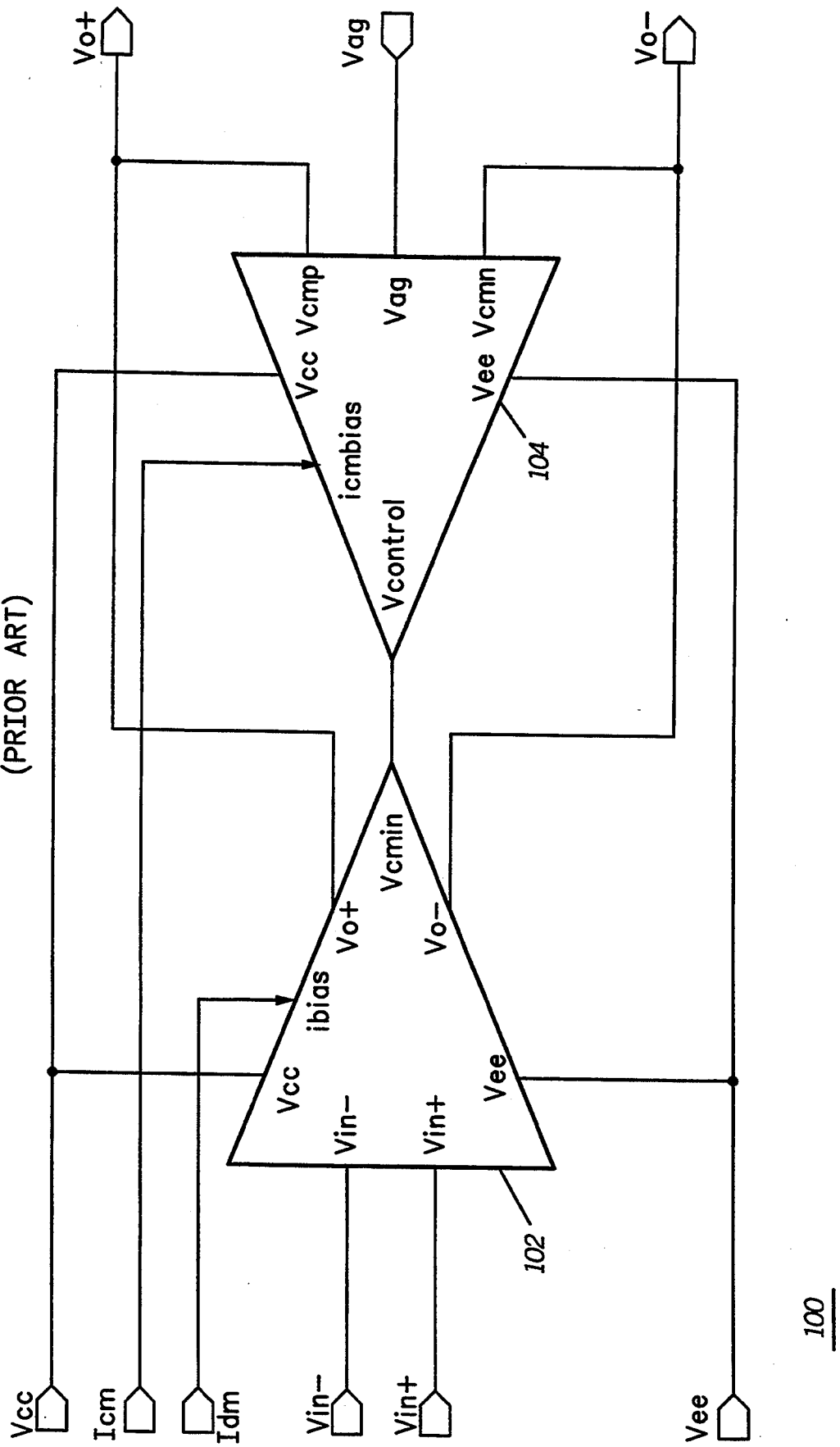
FIG. 1 shows a block diagram of a prior art fully differential op amp with common mode feedback.
Figure 2:
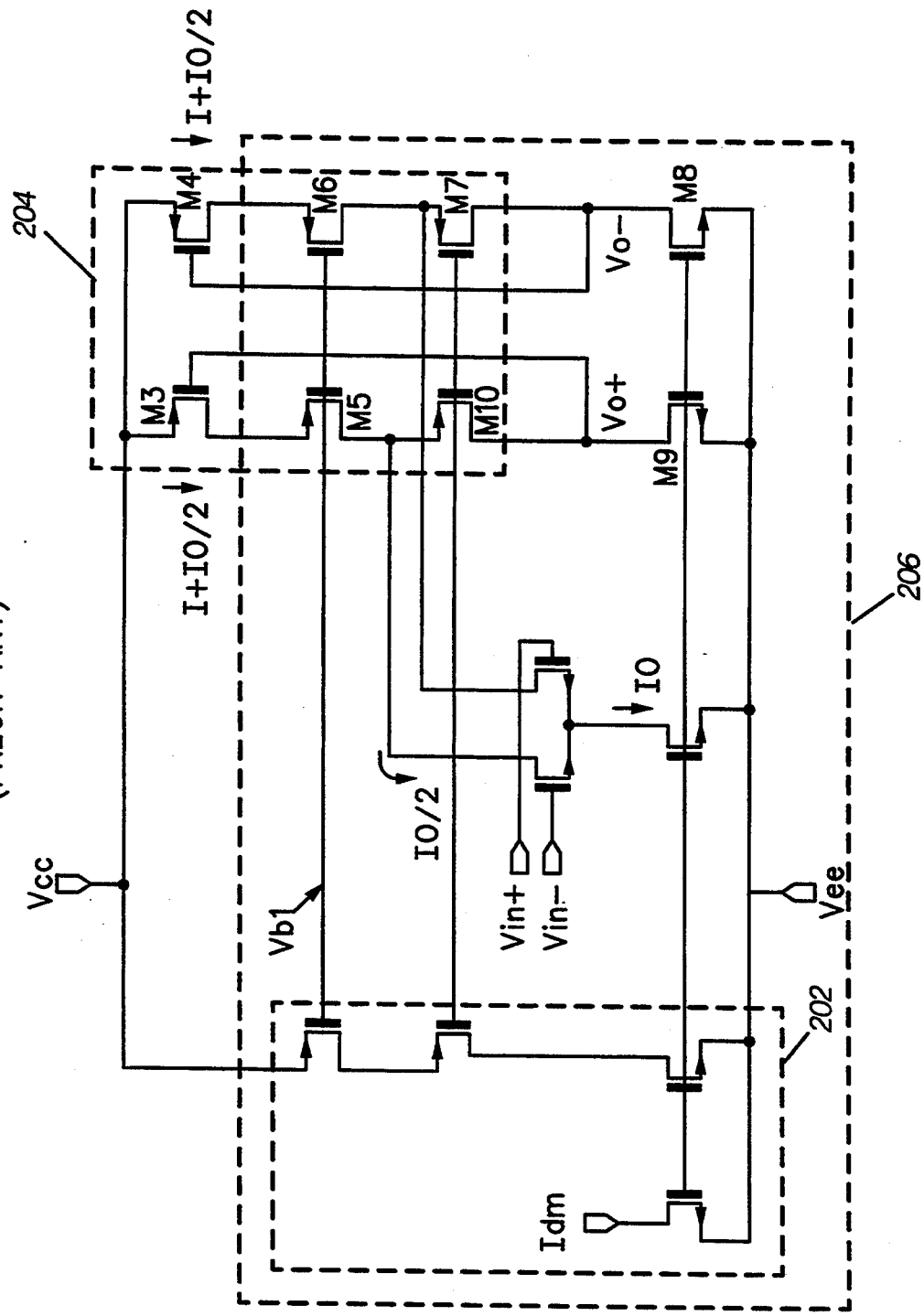
FIG. 2 shows a prior art circuit diagram for a fully differential CMOS op amp with continuous time common mode feedback.
Figure 3:
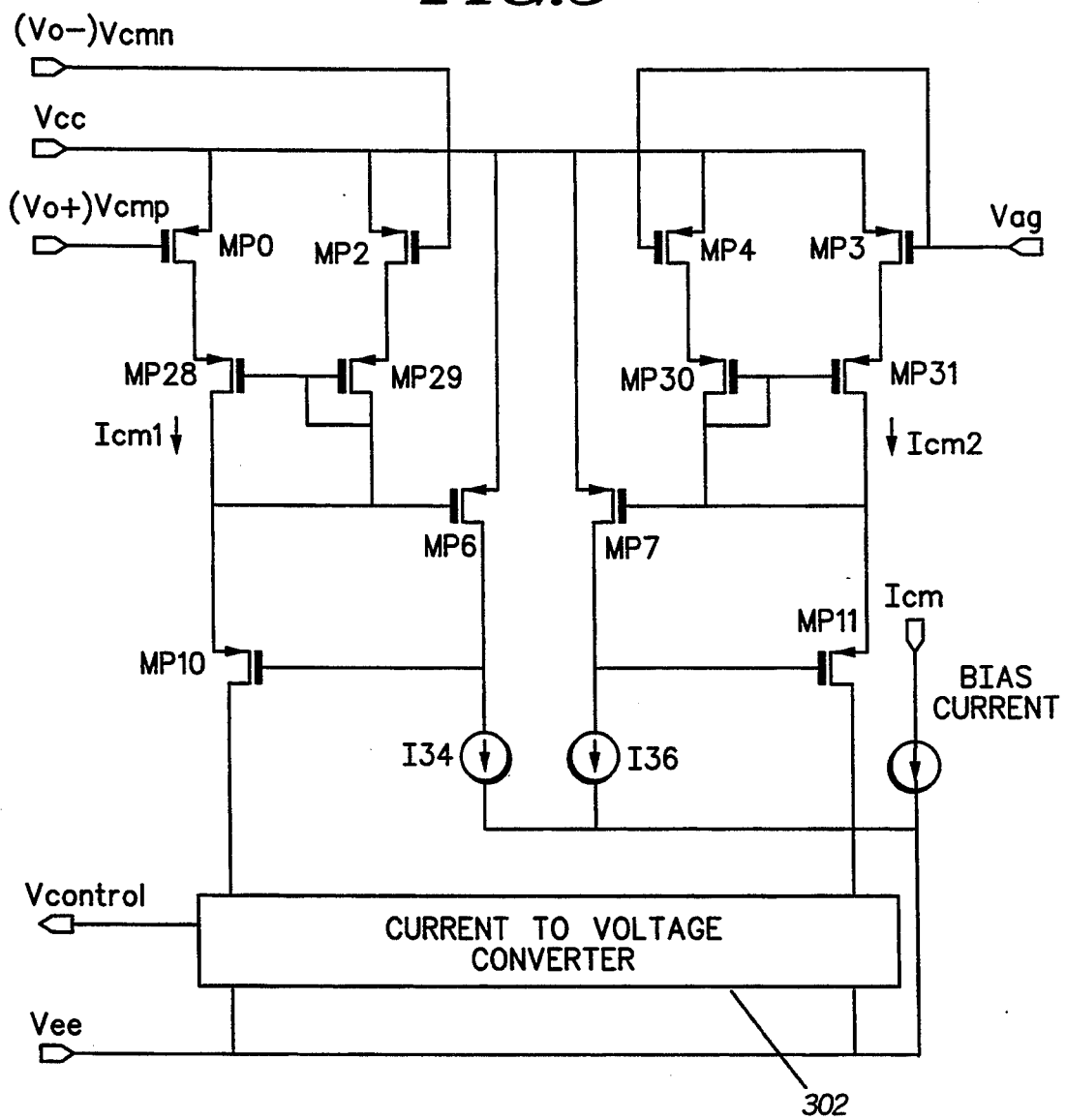
FIG. 3 shows circuit diagram for a continuous time common mode feedback amplifier in accordance with the present invention.

A continuous time common mode feedback amplifier (CTCMFB) that operates at low voltages, such as Vcc=2.7V, is shown in FIG. 3 of the accompanying drawings and will be referred to as common mode amplifier 300. The common mode amplifier 300 includes two differential inputs, Vcmp and Vcmn, that are supplied by differential outputs, Vo+ and Vo−, of a main differential amplifier, such as shown in FIG. 1. The common mode amplifier 300 regulates the differential outputs (Vo+, Vo−) of the main differential amplifier. Also included in the common mode amplifier 300 are two mirror image low gain CMOS common source amplifiers made out of input transistors, preferably P-channel FETs, MP0/MP2 and MP3/MP4 and biased by bias devices MP6 and MP7 which are in saturation. The gate of MP0 is tied to Vcmp, the gate of MP2 is tied to Vcmn and the gates of MP3 and MP4 are coupled together and tied to a reference voltage Vag. In this implementation the common source amplifiers (MP0/MP2 and MP3/MP4) convert the two common mode input voltages, Vcmp and Vcmn, and the reference voltage, Vag, into currents Icm1 and Icm2. These amplifiers are very low gain in order to provide operation as linear as possible over the entire differential output operating range, Vo+ to Vo−, of the main differential amplifier. Devices MP0/MP2 and MP3/MP4 are biased well into their triode (linear) region to ensure a fixed gain over a wide operating range, Vo+ to Vo−.

Devices MP28/MP29 and MP30/MP31, biased into their saturation regions, are coupled to the low gain common source amplifiers MP0/MP2 and MP4/MP3 to make the drain to source voltages, Vds, of the low gain source amplifiers close to zero volts. Bias FETs MP6 and MP7 are biased into saturation by current sources I34 and I36 respectively, to define the drain to source voltage of the low gain common source amplifiers (MP0/MP2 and MP3/MP4). The current sources I34 and I36 are provided by a current mirror circuit biased by bias current Icm. The Vds value for devices MP0/MP2 and MP3/MP4 is chosen very low to ensure triode region of operation. Devices MP10 and MP11 are cascode transistors biased by Icm1 and Icm2 respectively. Cascode FETs MP10 and MP11 are operatively coupled to the low gain FET amplifier circuits MP0/MP2 and MP3/MP4 for providing bandwidth boosting of the common mode amplifier 300. By clamping the input transistors, MP0/MP2 and MP3/MP4, in the triode region, the gain of the common mode amplifier 300 is held constant over a wide input voltage range, Vcmp to Vcmn, which is the differential output range, Vo+ to Vo−, of the main differential amplifier.

Also included in the common mode amplifier 300 is a current to voltage converter 302 for transforming the currents Icm1 and Icm2 into a common mode control output voltage, Vcontrol. Because of the circuit symmetry, in quiescent conditions, Icm1 is equal to Icm2 forcing Vcmn and Vcmp to be equal to Vag. The common mode output voltage, Vcontrol, will be fed back to the main differential op-amp input port, Vcmin, to force the common mode input nodes, Vcmp and Vcnm, to remain at Vag, i.e. (Vcmp+Vcmn)/2=Vag. The reference input, Vag, may be driven by the midpoint between Vcc and Vee supply voltages in a dual supply configuration. The reference voltage, Vag, is therefore coupled to ground potential in a dual supply configuration where the second supply voltage, Vee, is of equal value and opposite potential to the Vcc supply voltage. The reference input is coupled to half of the Vcc supply voltage when the second supply voltage, Vee, is at ground potential (single supply configuration).

Any increase or decrease in the common mode input voltages, Vcmn/Vcmp, produces an increase or decrease in the current Icm1, resulting in an increase or decrease in the output voltage Vcontrol. This voltage will then be used by the main differential amplifier to provide an opposite change in the common mode output voltage, Vcm=(Vo++Vo−)/2, thus forcing the common mode input voltages of the common mode amplifier, Vcmn/Vcmp, to remain at Vag. The common mode feedback amplifier 300 is independently compensated for transient response time by controlling the bandwidth with adjustments to the bias currents Icm1 and Icm2 thus making it independent of the main differential amplifier 102. The common mode amplifier bandwidth and control voltage output, Vcontrol, are independently biased from the main differential amplifier.

The CTCMFB amplifier 300 as described by the invention, is a resistorless amplifier that uses transistors biased in their triode region to accurately set a common mode bias point, Vcmp=|Vcmn|=Vag, to provide a wide operating range. Furthermore, the CTCMFB amplifier 300 is applicable to any CMOS or BICMOS differential amplifier. The CTCMFB 300 as shown in FIG. 3, excluding the current to voltage converter 302, is comprised of P-channel FETs, however the CTCMFB could be designed using N-channel devices as well.

The continuous time common mode feedback circuit 300 as described by the invention, is suitable for low voltage single supply environments as well as dual supply environments and allows the transient response time of the common mode amplifier to be adjusted independently of the transient response time of the main differential amplifier allowing for a fast transient response to the fully differential amplifier.

What is claimed is:

1. A CMOS common mode differential amplifier having first and second supply nodes for receiving first and second supply voltages, first and second common mode inputs, and a reference input, comprising:

first and second low gain FET amplifier circuits coupled in a mirror image configuration for providing first and second common mode currents;

first and second bias FETs biased in saturation for biasing the first and second low gain FET amplifier circuits into their triode region;

first and second cascode FETs operatively coupled to the first and second low gain FET amplifier circuits for controlling a response time of the CMOS common mode differential amplifier;

a current mirror circuit for providing first and second current sources to bias the first and second bias FETs; and a current to voltage converter responsive to the first and second common mode currents for providing a control voltage output of the CMOS common mode differential amplifier.

2. A CMOS common mode differential amplifier as described in claim 1, further comprising first and second pairs of FETs biased into their saturation region and each coupled to one of the first and second low gain FET amplifier circuits for further biasing them into their triode region.

3. A CMOS common mode differential amplifier circuit as described in claim 1, wherein the first low gain FET amplifier circuit comprises:
   a first FET driven by the first common mode input and supplied by the first supply voltage, for providing the first common mode current; and
   a second FET substantially identical to the first FET, supplied by the first supply voltage and driven by the second common mode input.

4. A CMOS common mode differential amplifier as described in claim 3, wherein the second low gain FET amplifier circuit comprises third and fourth substantially identical FETs supplied by the first supply voltage, and driven by the reference input.

5. A CMOS common mode differential amplifier as described in claim 4, wherein the FETs comprise P-channel FETs.

6. A CMOS common mode differential amplifier as described in claim 1, wherein the reference input is driven by the midpoint between said first and second supply voltages.

7. A CMOS common mode differential amplifier as described in claim 1, wherein the reference input is coupled to ground potential when the first and second supply voltages are coupled to equal and opposite voltage potentials.

8. A CMOS common mode differential amplifier as described in claim 1, wherein the reference input is coupled to half of the first supply voltage when the second supply node is at ground potential.

9. A CMOS continuous time common mode feedback amplifier having first and second supply nodes for receiving first and second supply voltages, first and second common mode inputs, and a reference input, comprising:
   first and second low gain FET amplifier circuits coupled in a mirror image configuration for providing first and second common mode currents, the first low gain FET amplifier circuit comprises a first FET driven by the first common mode input and supplied by the first supply voltage, for providing the first common mode current and also comprises a second FET substantially identical to the first FET, supplied by the first supply voltage and driven by the second common mode input, the second low gain FET amplifier circuit comprises third and fourth substantially identical FETs supplied by the first supply voltage, and driven by the reference input;
   first and second bias FETs biased in saturation for biasing the first and second low gain FET amplifier circuits into their triode region;
   first and second cascode FETs operatively coupled to the first and second low gain FET amplifier circuits for controlling a response time of the CMOS continuous time common mode feedback amplifier;
   a current mirror circuit for providing first and second current sources to bias the first and second bias FETs;
   a current to voltage converter responsive to the first and second common mode currents for providing a control voltage output of the CMOS continuous time common mode feedback amplifier; and
   first and second pairs of FETs biased into their saturation region and each coupled to one of the first and second low gain FET amplifier circuits for further biasing them into their triode region.

10. A fully differential operational amplifier with common mode feedback, comprising:
    a main differential amplifier for receiving a differential input voltage and providing a differential output, the main differential amplifier also providing a first bandwidth for controlling a first response time for the main differential amplifier; and
    a continuous time common mode feedback amplifier (CTCMFB) responsive to the differential output, for providing a control voltage output, wherein the control voltage output is independently biased from the main differential amplifier and is fed back to the main differential amplifier, the CTCMFB amplifier providing a second bandwidth for controlling a second response time and independently biasing the first response time of the main differential amplifier from the second response time of the CTCMFB amplifier.

11. A fully differential operational amplifier as described in claim 10, wherein the CTCMFB amplifier comprises first and second low gain amplifier circuits coupled in a mirror image configuration and biased into their triode regions for controlling the control voltage output.

12. A fully differential operational amplifier comprising:
    a main differential amplifier providing a first response time; and
    a continuous time common mode feedback amplifier operatively coupled to the main differential amplifier and providing a second response time,
    said first and second response times independently biased so as to provide a fast transient response time of the fully differential operational amplifier.

13. A fully differential operational amplifier as described in claim 12, wherein the continuous time common mode feedback amplifier is resistorless.

* * * * *